US010165366B1

United States Patent
Root

(10) Patent No.: US 10,165,366 B1
(45) Date of Patent: Dec. 25, 2018

(54) MOLDABLE MOUNTING WIRELESS SPEAKER SYSTEM FOR USE IN A VARIETY OF SETTINGS

(71) Applicant: Philip Root, Boca Raton, FL (US)

(72) Inventor: Philip Root, Boca Raton, FL (US)

( * ) Notice: Subject to any disclaimer, the term of this patent is extended or adjusted under 35 U.S.C. 154(b) by 0 days.

(21) Appl. No.: 15/915,355

(22) Filed: Mar. 8, 2018

(51) Int. Cl.
| | |
|---|---|
| *H04B 3/00* | (2006.01) |
| *H04R 3/12* | (2006.01) |
| *H04R 1/02* | (2006.01) |
| *H04R 1/28* | (2006.01) |
| *H04W 4/80* | (2018.01) |
| *H04W 76/10* | (2018.01) |
| *G08B 5/36* | (2006.01) |
| *H03G 3/10* | (2006.01) |

(52) U.S. Cl.
CPC ............... *H04R 3/12* (2013.01); *G08B 5/36* (2013.01); *H03G 3/10* (2013.01); *H04R 1/025* (2013.01); *H04R 1/026* (2013.01); *H04R 1/2888* (2013.01); *H04W 4/80* (2018.02); *H04W 76/10* (2018.02); *H04R 2420/07* (2013.01)

(58) Field of Classification Search
CPC .......... H04R 3/12; H04W 4/80; H04W 76/10; H03G 3/10
See application file for complete search history.

(56) References Cited

U.S. PATENT DOCUMENTS

| | | | | |
|---|---|---|---|---|
| 2014/0169795 A1* | 6/2014 | Clough | ............... | G06F 19/3418 398/106 |
| 2014/0270318 A1* | 9/2014 | Cho | ..................... | A44C 5/0015 381/385 |
| 2014/0338397 A1* | 11/2014 | Andreini, III | ....... | A44C 15/005 63/1.14 |
| 2016/0080855 A1* | 3/2016 | Greenberg | ........... | H04R 1/1066 381/74 |
| 2016/0119700 A1* | 4/2016 | Miskin | ................... | H04R 5/023 381/333 |
| 2016/0366506 A1* | 12/2016 | Kim | ..................... | H04R 5/0335 |

* cited by examiner

*Primary Examiner* — Simon King
(74) *Attorney, Agent, or Firm* — The Rapacke Law Group, PA

(57) ABSTRACT

Embodiments described herein related a moldable mounting wireless speaker system which provides a secure wireless communication link between a set of wireless speakers and a selected host mobile device once a pairing code is established. The system includes a set of wireless speakers, Bluetooth module, processor, and infrared transceiver module enclosed within a hermetically sealed housing and located at each end of a flexible and moldable mounting strip comprised of a plurality of spherical connectors. The system is configured to receive both infrared and radio frequency inputs and convert to a digital signal to initially authenticate the pairing code by attempting to match the pairing code from the host mobile device with a plurality of stored pairing codes within the memory. Once authenticated, a light emitting diode will be illuminated and visible through a translucent portion of the housing to indicate that the secure communication link is established. The user may then secure and bend the system to a variety of objects using the securing grips located around each of the spherical connectors.

20 Claims, 4 Drawing Sheets

MOLDABLE MOUNTING WIRELESS SPEAKER SYSTEM FOR USE IN A VARIETY OF SETTINGS

FIELD

The embodiments relate to a wireless speaker system, and in particular, to a wireless speaker system having a plurality of spherical connectors which enable use in a variety of settings.

BACKGROUND

With the progressively greater mobility and reliance on technology by people in today's society, it has become an increasingly important feature in any electronic device that it be both portable and versatile and connectable to a variety of wireless mobile devices.

The first step towards versatility was embodied in streamlined audio and video connectors, male and female, which permitted devices to communicate with each other regardless of the manufacturer. These devices still faced the burden of requiring wired connectors to be incorporated and included in the devices, which as technology has evolved, the designs and standards for these connectors have changed. Subsequently, the push towards wireless communication between devices sought to eliminate wires and permit devices to communicate at various distances through universal means such as Bluetooth.

Bluetooth is a preferred communication means for wireless designs because of its ability to operate with only minimal power input. Additionally, Bluetooth is not frequently interfered with by unwanted errant devices because it functions within a relatively confined area within which the devices a user frequently utilizes to communicate are already contained. With regard to audio speakers, Bluetooth technology is frequently incorporated into wireless headsets, such as single or dual speaker headphones, which are then able to communicate with a host device, such as a mobile phone, tablet, or personal computer. These Bluetooth headsets are commonly configured to both receive electrical signals which may then be converted into sound through the speakers, and to send signals to the host which may control the audio playback.

By isolating the sounds outside of the headphone attached to the seal created at the user's head and ears, certain headsets are capable of introducing equally opposite noises which effectively cancel out such ambient room noise thereby making it largely inaudible to the user. Headsets, however, incorporate several inherent pitfalls by design, including the fact that they must be worn by the specified user and that they may only be enjoyed by a single user at a time. Consequently, the benefits of such technology necessitate having separate devices for each desired user or else the remaining users will be unable to use the device concurrently.

There are several multi-speaker audio systems in the art which are able to be enjoyed by all users within an area, but they are typically wired and are without the same noise-canceling benefits found in headsets. These other systems are typically hard-wired to the host and are permanently or otherwise affixed in a stationary manner, such as in the wall, ceiling, or on a weighted stand. Due to these limitations, typical speaker systems are not easily portable for a user who desires to take them with him or her to use in a variety of settings in the same manner as headsets which are smaller and designed to be easily transported and connected. Portability for persons today requires that a device be capable of being disconnected, transported, reconnected, and used from setting to setting with little-added effort or time and without excessive burden. This is frequently embodied in a single, handheld device that does not require additional connectors or cables for typical use.

SUMMARY OF THE INVENTION

The embodiments provided illustrate a mobile mounting wireless speaker system for use in a variety of residential and commercial settings by simply mounting the system around the desired object. The system includes a set of wireless speakers, processor, Bluetooth module, infrared transceiver enclosed within a hermetically sealed housing and connected at each end of an elongated and flexible mounting mechanism a secure the wired connection extending between each of the wireless speakers.

In one embodiment the system is configured to receive an electrical signal from a host mobile device and converted the signal to digital signal using either the Bluetooth module or infrared transceiver. Once the digital pairing code is received at the processor, it is then compared with the plurality of stored pairing codes corresponding to various mobile devices produced by a variety of manufacturers stored in the memory using the processor's comparator. The system utilizes Bluetooth protocols to create a secure wireless communication link with the host mobile device which is first received by the systems Bluetooth module or Infrared transceiver from the host mobile device radio transceiver which is configured to automatically retrieve Bluetooth address information from the host mobile devices in proximity.

In the preferred embodiment the system illustrates the mounting mechanism that is comprised of releasably attached spherical connectors which are connected to each other using a male-female fitting which may be selectively detached to adjust the length of the mechanism. Further secured within each of the spherical connectors is the wire connecting each of the wireless speakers and housing. Once a secure wireless connection link is established with the host mobile device, a mold and configured the system to variety of objects, power the system using the push-button power switch, and adjust the volume manually with the knob or wirelessly using the volume control inputs from the host mobile device to channel music in a preferred direction.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

A more complete understanding of these embodiments, and the attendant advantages and features thereof, will be more readily understood by reference to the following detailed description when considered in conjunction with the accompanying drawings. The drawings described herein may not be to scale, are for illustrative purposes only of selected embodiments and not all possible implementations, and are not intended to limit the scope of the present disclosure.

DETAILED DESCRIPTION

Figure 1:
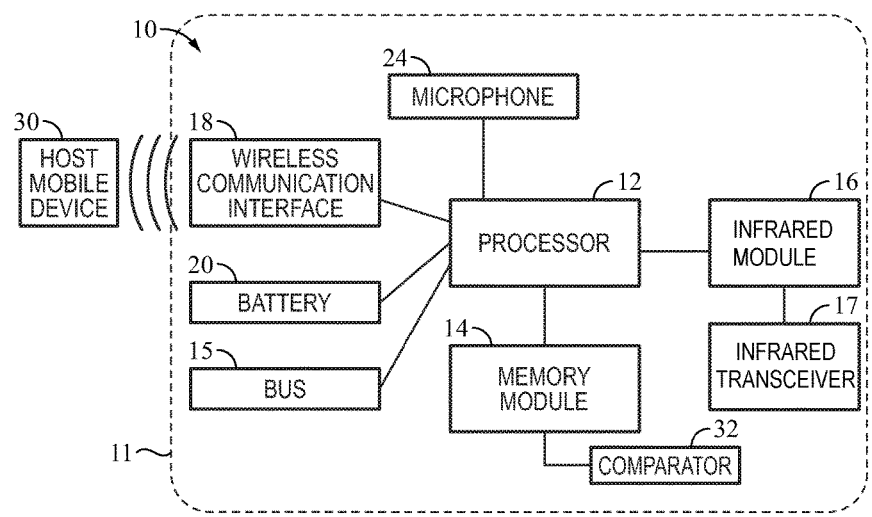
FIG. 1 illustrates a schematic view of the moldable mounting wireless speaker system.

Any reference to "invention" within this document is a reference to an embodiment of a family of inventions, with no single embodiment including features that are necessarily included in all embodiments, unless otherwise stated. Furthermore, although there may be references to "advantage's" provided by some embodiments, other embodiments may not include those same advantages, or may include different advantages. Any advantages described herein are not to be construed as limiting to any of the claims.

Before describing in detail exemplary embodiments, it is noted that the embodiments reside primarily in combinations of components related to the wireless speaker set and flexible mounting means. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Specific quantities, dimensions, spatial characteristics, compositional characteristics and performance characteristics may be used explicitly or implicitly herein, but such specific quantities are presented as examples only and are approximate values unless otherwise indicated. Discussions and depictions pertaining to these, if present, are presented as examples only and do not limit the applicability of other characteristics, unless otherwise indicated.

The present embodiments provide a wireless speaker system having a flexible and versatile mounting mechanism which is designed to be mounted and fitted onto a variety of objections to provide high-quality noise-canceling sound from a set of wireless speakers. Each of the speakers is enclosed within a hermetically sealed housing to prevent moisture exposure. After the system has paired with the host mobile device and a secure wireless communication link is established, the sound through the speakers may be further channeled and directed in a variety of directions using a set of sound deflectors which act to cancel any ambient noise while channeling noise in a preferred direction. The system and alternative embodiment further provide for signal input from HDMI, digital, optical, analog, and microphone sources which after converting to a digital signal may stream data securely via Bluetooth, wired, or wireless fidelity (i.e., Wifi) means.

Referring now to the drawings wherein like referenced numerals designate identical or corresponding parts throughout the views, there is shown in FIG. 1 a block diagram illustrating the control architecture of a moldable and mountable wireless speaker system 10 according to the preferred embodiment. The block diagram further illustrates part of the system that is enclosed within a hermetically sealed housing 11. Affixed within the housing 11 is a processor 12 memory module 14, bus 15, Bluetooth Module 16 including the Bluetooth receiver 17, wireless communication interface 18, battery power source 20, microphone 24, and infrared transceiver 26. In some examples, the quantity, type, function, structure, and configuration of the housing 11 and control architecture (e.g., processor 12, memory module 14, bus 15, Bluetooth Module 16 including the Bluetooth receiver 17, wireless communication interface 18, battery power source 20, microphone 24, and infrared transceiver 26 shown may be varied and are not limited to the examples provided. As shown, the processor 12 may be implemented to provide logical operations, control functions and signals to the memory module 14, input volume control means from a host mobile device 28, operating system 32, battery power source 20, and a wireless communication interface 18.

The processor 12 may be implemented using any type of processor or microprocessor suitable for packaging within the housing 11. Further, various types of microprocessors may be used to provide data processing capabilities and are not limited to any specific type or capability. Different processors 12 may be desired if other functionality (e.g., the type and number of operating systems or other components within the control architecture) are varied.

The memory module 14 is configured to store a variety of streamed data including a plurality of pairing codes to a variety of commercial and residential smart devices (i.e., host mobile devices) via a secure wireless communication link. In some examples, the memory module 14 may be implemented using various types of data storage technologies and standards, including, without limitation, read-only memory ("ROM"), random access memory ("RAM"), dynamic random-access memory ("DRAM"), static random access memory ("SRAM"), static/dynamic random access memory ("SDRAM"), magnetic random access memory ("MRAM"), solid state, two and three-dimensional memories, and Flash®. The memory module 14 may also be implemented using one or more partitions that are configured for multiple types of data storage technologies to allow for non-modifiable (i.e., by a user) software to be installed (e.g., firmware installed on ROM) while also providing for storage of captured data and applications using, for example, RAM. Once the data is streamed and received and/or stored in memory module 14, data may be subjected to various operations performed by other including comparing the received pairing commands from host mobile device 30 using a comparator 32 to identify if a match is created between a receiving pairing command code from a desired host mobile device 30.

Power may be stored in a battery power source 20, which may be implemented as a battery 20, battery module, power management module, or the like. Power may also be gathered from local power sources such as solar panels, thermoelectric generators, and kinetic energy generators, among others, that are alternative power sources to external power for a battery. These additional sources can either power the system directly or can charge a battery, which, in turn, is used to power the system 10. The battery power source 20 may include a rechargeable, expendable, replaceable, or another type of battery 20, but also circuitry, hardware, or software that may be used in connection with processor 12 in order to provide power management, charge/recharging, sleep, or other functions. Further, the battery power source 20 may be implemented using various types of power source technologies, including Lithium Ion ("Li"), Nickel Metal Hydride ("NiMH"), or others, without limitation. Power drawn as electrical current may be distributed from the battery power source 20 via bus 15, the latter of which may be implemented as deposited or formed circuitry or using other forms of circuits or cabling, including flexible circuitry. Electrical current distributed from the battery power source 20 and managed by processor 12 may be used by the memory module 14, microphone 24, infrared transceiver 26, Bluetooth module 16, or wireless communication interface 18 and the like.

Figure 2:
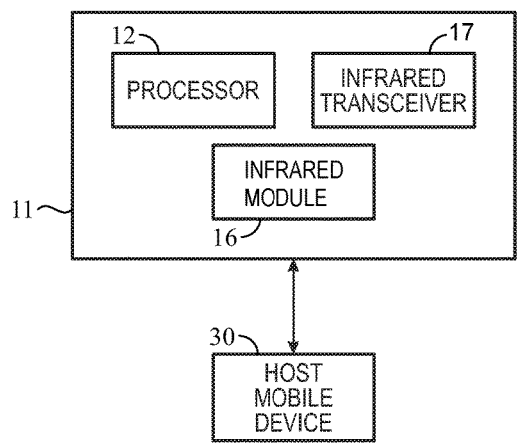
FIG. 2 illustrates a block diagram and control architecture of the system.

Shown in FIG. 2 is a further block diagram illustrating the control architecture of the Bluetooth module 16 and Bluetooth transceiver 17, and infrared transceiver 26 according to one embodiment. As shown in FIG. 2, the Bluetooth module 16 includes the Bluetooth transceiver 17 which are electrically connected to the processor 12. As illustrated in the current embodiment, the Bluetooth module 16 is electrically connected to the processor 12 to receive an audio signal wirelessly transmitted from the host mobile device 30. The processor 12, Bluetooth module 16, and infrared transceiver 26 can receive, demodulate, filter, and convert the analog radio frequency or infrared signal into a digital signal where it will be transmitted for authentication at the processor 12 and embedded comparator 32.

The initial data stream from the host mobile device 30 will further include a pairing command which requires the host mobile device 30 to connect to establish a wireless communication link between mobile devices. A request for pairing is generated by the host mobile device 30 which wirelessly finds and then connects to the wireless speakers. The headset may then optionally generate a passkey (i.e., link key) where it will be stored in the memory module 14 along with the unique Bluetooth address of the host mobile device 30 for future use.

The processor 12 and comparator 32 are configured to receive the pairing code and compare the received pairing code with the plurality of pairing codes stored in the memory module 14 to determine whether a match is established. The stored pairing codes include various wired and wireless headphones, tablets, and smart devices from various manufacturers). If a pairing code is found to be a match, a control command signal is transmitted through the Bluetooth module 16 to the host mobile device 30 to establish a secure wireless communication link. Upon establishing the secure wireless data link, the host mobile device 30 may execute corresponding functionality such as music playback and input volume control commands where they are performed in conjunction with the wireless communication interface 18.

In one example, if the wireless speaker is produced by manufacturer 1, which includes a control interface typically found in the wireless device market with universal commands such as such as volume "+" (up) button, volume "−" (down) button or alternatively includes a single command button. When the user presses the volume "+" button of the mobile control interface 18 and processor 12 receives and decodes the command signal from the system 10 to create a unique control code. The processor 12 can then select the corresponding control code based on the mobile device type and manufacturer. Once the corresponding control code is selected corresponding to volume input change, the Bluetooth module 16 transmits the control code to the host mobile device 30 to enable the volume change to be executed by the host mobile device 30. The system 10 enables the user to input and control function and buttons right from the wireless speakers.

Further illustrated in FIG. 2 is a block diagram which depicts the Bluetooth wireless communication protocol. A physical bus hardware connects the Bluetooth module 16 to the control hardware and circuitry which include a baseband controller and controller interface (HCI), as well as a link manager. During the data streaming after the secure wireless communication link has been established, the host controller interface encodes the received data into a format of HCI packet where it is provided to the Bluetooth host using the bus 15. Further, various functionality may be performed after the HCI packet has been received and processed by the bus 15, and an HCI driving program.

In an alternative embodiment, the system includes an infrared transceiver 26 which provides for converting means for receiving the electrical audio signal from the host mobile device 30, converting that signal to an infrared audio signal to be radiated into the signal/listening area 10, and the infrared signal into a digital signal where it is sent to the processor 12. The converting means is processed at the infrared transmitter 26. The infrared transmitter 26 may further include a plug or other attachment means for electrically connecting the infrared transmitter to the host mobile device 30 by inserting a plug within the host mobile device jack 31. When configured as such, the infrared transmitter 26 receives the electrical audio signal, in both left and right channels at each of the wireless speakers, from the host mobile device 30. From the plug, the signal enters a compression and pre-amplification mechanism, where the signal is pre-amplified and compressed for more efficient and noise-free transmission to each of the wireless speakers.

Figure 3:
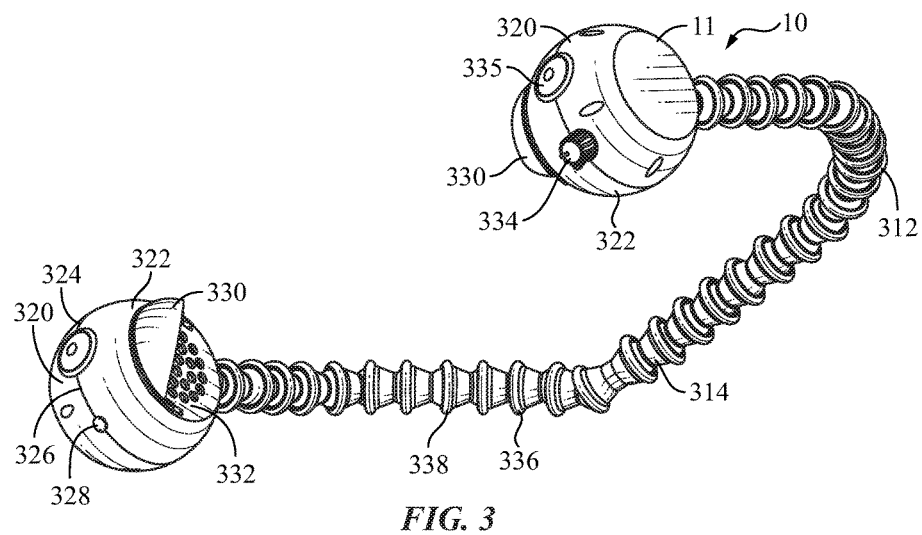
FIG. 3 illustrates a perspective view of the system.

Shown in FIG. 3 is a perspective view of the system 10 including the housing 11 and flexible mounting means 312 which are comprised of a plurality of spherical connectors 314, which are linked together. It is contemplated the housing 11, and flexible mounting means are comprised of high durometer molded or injection molded plastic or thermoplastic. However, any suitable material may be used as long as it provides a hermetic seal around the wireless speakers and control architecture and enables each of the spherical connectors 314 to rotate about its planar axis which extends from the top 316 to the bottom 318 portions of each spherical connector.

The housing 11 is further comprised of a top section 320 and bottom section 322 connected and hermetically sealed along the perimeter 324 of the midsection 326. The housing 11 further includes a cylindrically shaped translucent portion 328 which when illuminated using the contained light emitting diode (LED) provides notification to the user that a secure wireless communication link has been established with the host mobile device 30.

Further shown in FIG. 3 is the pair of noise deflectors 330 which protrude outward from the inside surface of the housing 332 to deflect and channel the noise while providing a barrier to external source noise and intensity. To adjust the volume, the user may simply turn the volume knob 334 or provide input from the host mobile device 30. A push-button switch 335 is electrically connected to the battery power source 20 to provide power to the system when placed in a depressed "on" position.

Further illustrated in the preferred embodiment on each of the spherical connectors 314 is a gripping portion 336 comprised of a low durometer rubberized material which extends around the perimeter 338 of each spherical connector 314. The gripping portion 336 allows each spherical connector 314 to grip mounting surfaces more readily. In some embodiments, the gripping portion is co-molded into the connector body or comprised of various textured material as a rubber substitute. The gripping portion may provide a higher interface friction when wrapped around an object as illustrated in FIGS. 5-7.

Figure 4:
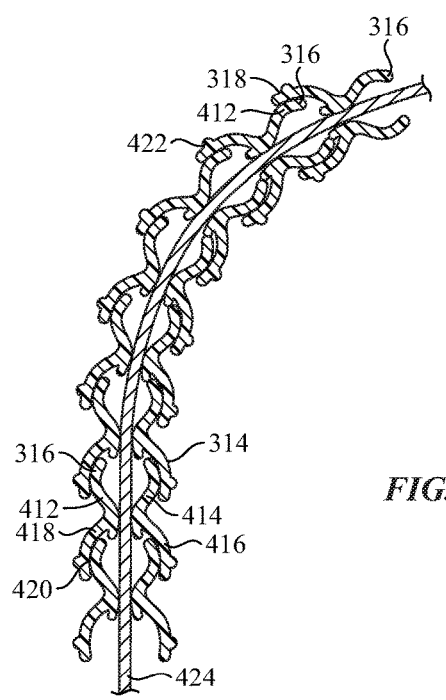
FIG. 4 illustrates a cross-sectional view of the spherical connectors of the system.

Shown in FIG. 4 is a cross-sectional view of the plurality of spherical connectors 314 according to the preferred embodiment. Each of the spherical connectors 314 have a top 316 and bottom 318 with an engaging surface 412 located at the first end 316 which enables the connector to rotate about its planar axis and laterally flex in any 90-degree direction. The first end 316 is substantially hollow and "U"-shaped. The second end 318 has a body 412 with a connector receiving cavity portion 414 and uniformly thick sidewalls 416. An inner surface 418 of each spherical connector is designed to fit in the socket using a male-female fitting 420, and a mechanical bulge 422 prevents over angulation or inadvertent separation of each spherical connector pair. Each of the spherical connectors 314 further include an aperture 424 which allows for a variety of wired connections between each wireless speaker.

Figure 5:
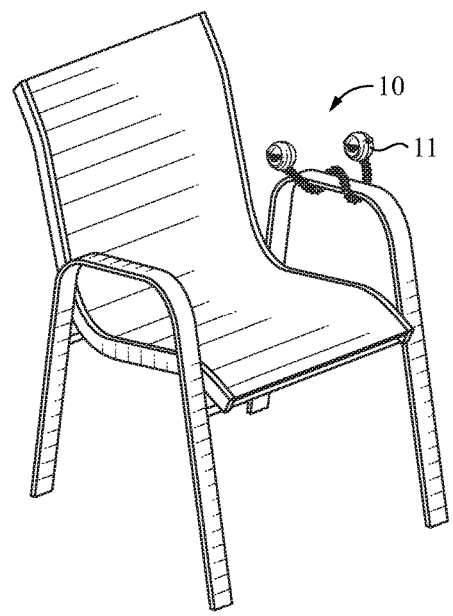
FIG. 5 illustrates the system mounted to a chair.
Figure 6:
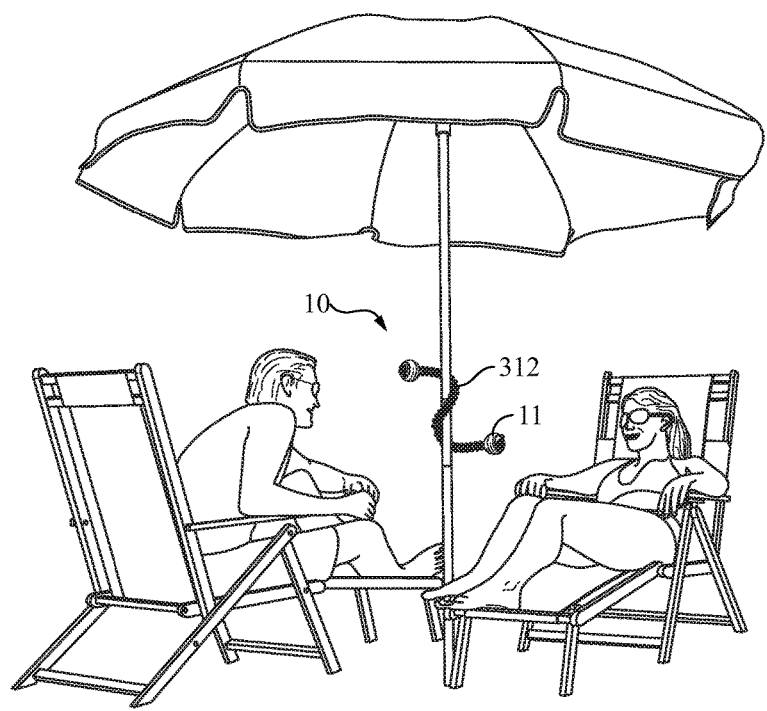
FIG. 6 illustrates the system mounted to an umbrella.
Figure 7:
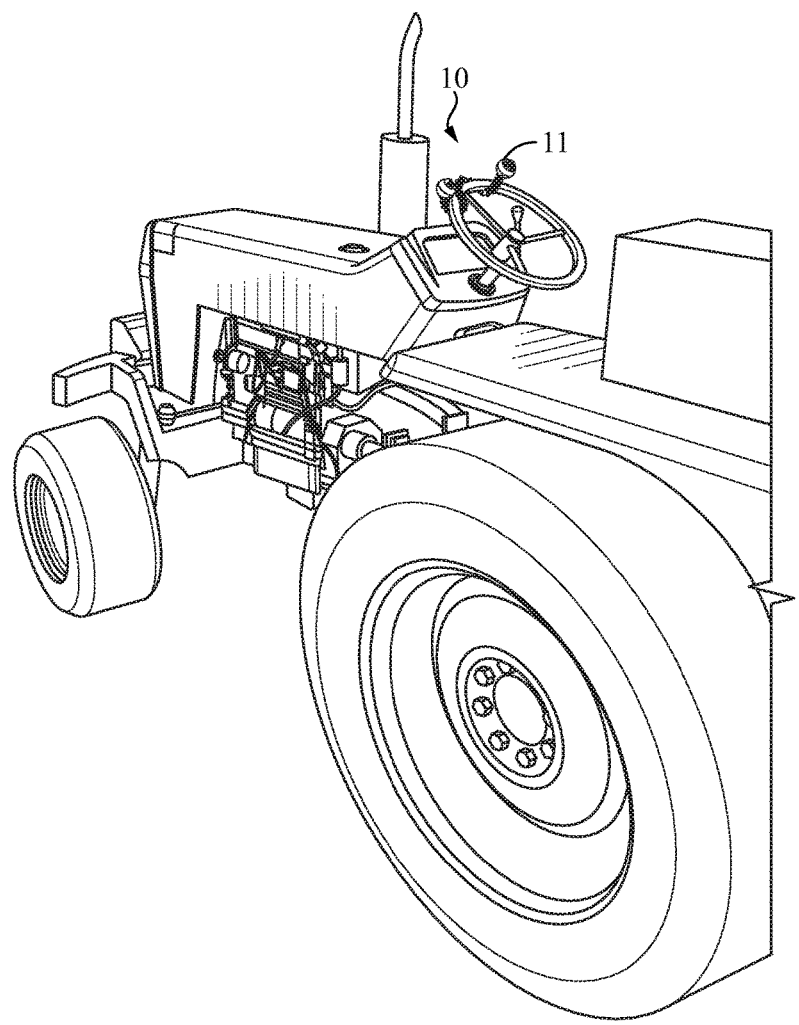
FIG. 7 illustrates the system mounted to a steering wheel.

Shown in FIGS. 5-7 are a variety of views illustrating the system being used and mounted in variety of a settings. In the present embodiments, when wrapped or mounted, the internal friction is increased to provide an enhanced grip to the mounting surface.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the present embodiments are not limited to what has been particularly shown and described hereinabove. In addition, unless mention was made above to the contrary, it should be noted that all of the accompanying drawings are not to scale. A variety of modifications and variations are possible in light of the above teachings without departing from the scope of the following claims.

What is claimed is:

1. A flexibly mountable wireless speaker system, the system comprising:
    a set of wireless speakers interconnected and located at opposite ends of an elongated and moldable linkage comprised of a plurality of releasably connected spherical connectors;
    a Bluetooth module in communication with the set of wireless speakers and configured to:
        receive a modulated radio frequency carrier wave signal from a host mobile device;
        demodulate and convert the received radio frequency carrier wave signal from the host mobile device to a digital signal for processing using an embedded processor;
    a processor including an integrated memory module to:
        to receive a plurality of transfer data including a pairing code from a host mobile device;
        compare the digital signal including the pairing code data with a plurality of stored pairing code data corresponding to a variety of host mobile devices to determine if a pairing match is established using a comparator;
        cause a transmission of a consent code using the Bluetooth module to the host mobile device with which the pair match is established to allow a secure wireless communication link; and
        cause an illumination of at least one colored light emitting diode to indicate that a secure wireless communication link is established to the host mobile device.

2. The system of claim 1, further including a housing located at a first end and a second end of elongated and moldable linkage and further including an outwardly protruding noise deflector and configured to create a hermetically sealed enclosure around each of the set of wireless speakers.

3. The system of claim 2, wherein the hermetically sealed housing includes a cylindrically shaped translucent portion to the at least one colored light emitting diode to provide a notification to a user that the secure wireless communication link is established.

4. The system of claim 3, wherein the housing includes adjustable volume control knob having an input to each of the set of wireless speakers and provide a selective adjustment of audio output by each of the set of wireless speakers.

5. The system of claim 4, wherein the housing further includes a push-button switch electrically connected to a battery power source.

6. The system of claim 1, wherein the Bluetooth module is further configured to provide volume control input to each of the set of wireless speakers from the host mobile device when the secure wireless communication link is established.

7. The system of claim 1, wherein each of the plurality of spherical connectors includes an aperture at a first end and a second and is dimensioned to secure at least one wired connection extending between each of the set of wireless speakers.

8. The system of claim 7, wherein each of the plurality of spherical connectors includes textured adhesive strip affixed about the perimeter to provide an enhanced grip when mounted to a surface.

9. The system of claim 8, wherein each of the plurality of spherical connectors includes male-female fitting to:
    allow each of the spherical connectors to flex up to 90 degrees laterally from a fixed position; and
    adjust a length of the plurality of spherical connectors by adding/removing a pre-determined number of spherical connectors at a time.

10. A flexibly mountable wireless speaker system, the system comprising:
    an elongated and flexible mounting means comprised of a plurality of rotatable spherical connectors releasably linked to each other using a male-female coupling;
    a housing located at a first end and a second end of the elongated and flexible mounting means and further including an upper portion and lower portion which form a hermetically sealed enclosure around a set of wireless speakers;
    an infrared transceiver configured to convert an infrared light signal from a host mobile device to a digital signal;
    a Bluetooth module configured to:
        receive a modulated radio frequency signal from a host mobile device and convert the received signal to a digital signal;
        provide a secure wireless communication link to a host mobile device after a received pairing code has been authenticated using an electrically connected processor; and enable volume control input to each of the set of wireless speakers from the host mobile device when the secure wireless communication link is established;

a processor having an integrated memory module to:
  compare the digital signal including a received pairing code from the host mobile device with a plurality of stored pairing codes corresponding a variety of wireless devices to determine if a match is authenticated using an embedded comparator; and
  cause an illumination of at least one colored light emitting diode through a translucent portion of the housing to indicate that a secure wireless communication link with the host mobile device has been achieved.

11. The system of claim 10, wherein the each of the plurality of spherical connectors includes a plurality of apertures at a first and a second end of each of the spherical connectors dimensioned to secure a wired connection between the set of wireless speakers.

12. The system of claim 11, wherein each of spherical connectors allows for lateral movement up to 90 degrees from a focal axis plane extending from the first end to the second end of each spherical connector.

13. The system of claim 12, wherein each of the plurality of spherical connectors includes rubberized coasting strip about a perimeter of each of the rotatable spherical connectors to improve a gripping strength when mounted to an object.

14. The system of claim 10, wherein the housing further includes a push-button power switch in electrical communication with a battery power supply and positionable between a depressed "on" position and a raised "off" position.

15. The system of claim 13, wherein the housing further includes a cylindrically shaped volume control knob to provide a volume control input to each of the wireless speakers.

16. The system of claim 10, wherein each of the male-female couplings enable a length of the elongated and flexible mounting means to be adjusted by adding/removing a pre-determined number of spherical connectors.

17. A flexibly mountable wireless speaker system for use in a variety of settings, the system comprising:
  a flexible mounting means comprised of a plurality of rotatable spherical connectors releasably attached to each other using a male-female coupling;
  a cylindrically shaped housing located at a first end and a second end of the flexible mounting means and further including an upper portion and lower portion affixed at a midsection and configured to create a hermetic seal around a set of wireless speakers;
  an infrared transceiver configured to convert an infrared light signal from a host mobile device to a digital signal;
  a Bluetooth module configured to:
    receive a modulated radio frequency signal from a host mobile device and convert the received signal to a digital signal;
    provide a secure wireless communication link to a host mobile device after a received pairing code has been authenticated by an electrically connected processor; and
    enable a plurality of command codes to be transmitted to a host mobile device to enable at least a volume input to the wireless speakers to be controlled by the host mobile device when the secure wireless communication link is established;
  a processor having an integrated memory module to:
    compare the digital signal including a received pairing code from the host mobile device with a plurality of stored pairing codes corresponding a variety of wireless devices to determine if a match is authenticated using an embedded comparator; and
    cause an electrical transmission to illuminate a light emitting diode to provide a visual notification through a translucent portion of the housing to indicate that a secure wireless communication link with the host mobile device has been achieved.

18. The system of claim 17, wherein each of the plurality of spherical connectors includes a low durometer rubberized gripping strip around an outside perimeter of the spherical connectors increase an internal friction when mounted around an object.

19. The system of claim 17, wherein each of the plurality of spherical connectors includes an aperture at a top portion and a bottom portion to secure a wired connection between each of the wireless speakers.

20. The system of claim 17, wherein the housing includes an elliptically shaped noise deflection outwardly protruding from an inside surface of the housing to channel a noise in a desired direction.

* * * * *